United States Patent
Huang et al.

(10) Patent No.: US 11,189,538 B2
(45) Date of Patent: Nov. 30, 2021

(54) SEMICONDUCTOR STRUCTURE WITH POLYIMIDE PACKAGING AND MANUFACTURING METHOD

(71) Applicant: Taiwan Semiconductor Manufacturing Co., Ltd., Hsin-Chu (TW)

(72) Inventors: Chih-Fan Huang, Kaohsiung (TW); Mao-Nan Wang, Hsinchu (TW); Kuo-Chin Chang, Chiayi (TW); Hui-Chi Chen, Hsinchu County (TW); Dian-Hau Chen, Hsinchu (TW); Yen-Ming Chen, Hsin-Chu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/411,529

(22) Filed: May 14, 2019

(65) Prior Publication Data

US 2020/0105634 A1 Apr. 2, 2020

Related U.S. Application Data

(60) Provisional application No. 62/738,252, filed on Sep. 28, 2018.

(51) Int. Cl.
*H01L 23/522* (2006.01)
*H01L 23/29* (2006.01)
(Continued)

(52) U.S. Cl.
CPC .......... *H01L 23/293* (2013.01); *H01L 21/563* (2013.01); *H01L 21/76802* (2013.01);
(Continued)

(58) Field of Classification Search
CPC ... H01L 23/293; H01L 23/3171; H01L 24/08; H01L 24/03; H01L 23/5226;
(Continued)

(56) References Cited

U.S. PATENT DOCUMENTS 6,162,652 A * 12/2000 Dass .................. G01R 31/2884
257/E21.508
2002/0000665 A1 * 1/2002 Barr ........................ H01L 24/11
257/758
(Continued)

*Primary Examiner* — Bitew A Dinke
(74) *Attorney, Agent, or Firm* — Haynes and Boone, LLP

(57) ABSTRACT

The present disclosure provides a method that includes providing an integrated circuit (IC) substrate having various devices and an interconnection structure that couples the devices to an integrated circuit; forming a first passivation layer on the IC substrate; forming a redistribution layer on the first passivation layer, the redistribution layer being electrically connected to the interconnection structure; forming a second passivation layer on the redistribution layer and the first passivation layer; forming a polyimide layer on the second passivation layer; patterning the polyimide layer, resulting in a polyimide opening in the polyimide layer; and etching the second passivation layer through the polyimide opening using the polyimide layer as an etch mask.

20 Claims, 13 Drawing Sheets

(51) Int. Cl.
*H01L 23/31* (2006.01)
*H01L 23/00* (2006.01)
*H01L 23/528* (2006.01)
*H01L 21/56* (2006.01)
*H01L 21/768* (2006.01)

(52) U.S. Cl.
CPC ...... *H01L 23/3171* (2013.01); *H01L 23/5226* (2013.01); *H01L 23/5283* (2013.01); *H01L 24/03* (2013.01); *H01L 24/08* (2013.01); *H01L 2224/0231* (2013.01); *H01L 2224/02373* (2013.01); *H01L 2224/02381* (2013.01); *H01L 2224/0401* (2013.01); *H01L 2924/1205* (2013.01)

(58) Field of Classification Search
CPC ............... H01L 23/5283; H01L 21/563; H01L 21/76802; H01L 2924/1205; H01L 2224/0401; H01L 23/642; H01L 2224/8185; H01L 2224/0231; H01L 2224/02373; H01L 2224/02381; H01L 23/5329; H01L 23/5223; H01L 21/76804; H01L 23/525; H01L 23/3114; H01L 27/2418
See application file for complete search history.

(56) References Cited

U.S. PATENT DOCUMENTS

| | | | | |
|---|---|---|---|---|
| 2002/0079576 | A1* | 6/2002 | Seshan | H01L 24/05 257/737 |
| 2003/0013290 | A1* | 1/2003 | Greer | H01L 24/11 438/612 |
| 2004/0063900 | A1* | 4/2004 | Kaneshiro | B29C 41/46 528/353 |
| 2005/0006771 | A1* | 1/2005 | Akiyama | H01L 23/585 257/758 |
| 2008/0001291 | A1* | 1/2008 | Nagai | H01L 28/57 257/758 |
| 2008/0006441 | A1* | 1/2008 | Yamagata | H05K 3/28 174/260 |
| 2008/0135910 | A1* | 6/2008 | Youn | H01L 27/105 257/311 |
| 2008/0258195 | A1* | 10/2008 | Sugawara | H01L 28/57 257/295 |
| 2008/0258260 | A1* | 10/2008 | Nagai | H01L 21/76834 257/532 |
| 2009/0008783 | A1* | 1/2009 | Saigoh | H01L 24/48 257/760 |
| 2010/0013093 | A1* | 1/2010 | Stacey | H01L 24/13 257/737 |
| 2011/0186987 | A1* | 8/2011 | Wang | H01L 23/3192 257/737 |
| 2012/0181657 | A1* | 7/2012 | Wu | H01L 27/10852 257/532 |
| 2012/0319239 | A1* | 12/2012 | Chang | H01L 28/40 257/532 |
| 2014/0021584 | A1* | 1/2014 | Tu | H01L 27/10897 257/532 |
| 2014/0225222 | A1* | 8/2014 | Yu | H01L 24/97 257/532 |
| 2015/0102459 | A1* | 4/2015 | Lai | H01L 22/32 257/532 |
| 2015/0123242 | A1* | 5/2015 | Jen | H01L 23/5226 257/532 |
| 2015/0171161 | A1* | 6/2015 | Liang | H01L 28/75 257/532 |
| 2015/0221714 | A1* | 8/2015 | Gu | H01L 23/5383 257/532 |
| 2015/0279728 | A1* | 10/2015 | Topacio | H01L 24/11 257/632 |
| 2016/0086960 | A1* | 3/2016 | Wen | H01L 23/562 257/295 |
| 2016/0133688 | A1* | 5/2016 | Chun | H01L 24/05 257/532 |
| 2016/0163781 | A1* | 6/2016 | Lin | H01L 28/60 257/532 |
| 2017/0207147 | A1* | 7/2017 | Liao | H01L 23/5389 |
| 2017/0271203 | A1* | 9/2017 | Liu | H01L 24/19 |
| 2017/0278921 | A1* | 9/2017 | Chen | H01L 28/55 |
| 2018/0190582 | A1* | 7/2018 | Shih | H01L 23/5383 |
| 2018/0337000 | A1* | 11/2018 | Jen | H01G 4/06 |
| 2018/0351099 | A1* | 12/2018 | Yang | H01L 45/1253 |
| 2019/0113845 | A1* | 4/2019 | Yorisue | G03F 7/037 |
| 2020/0091063 | A1* | 3/2020 | Chen | H01L 23/5223 |
| 2020/0224029 | A1* | 7/2020 | Nakayama | C08G 73/1071 |

* cited by examiner

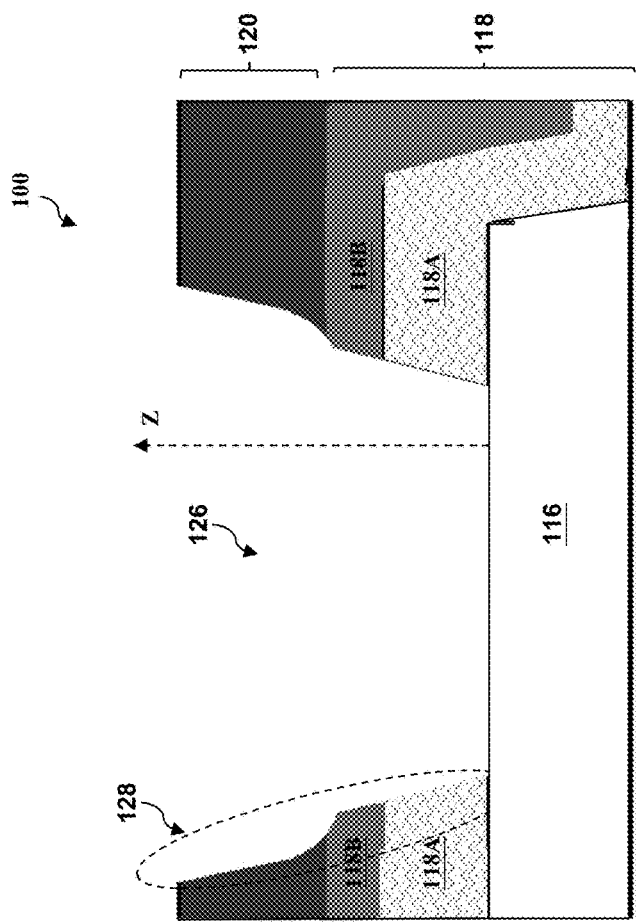
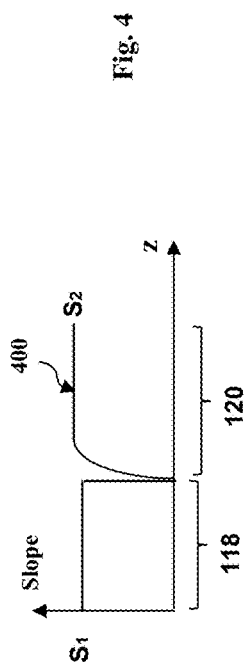
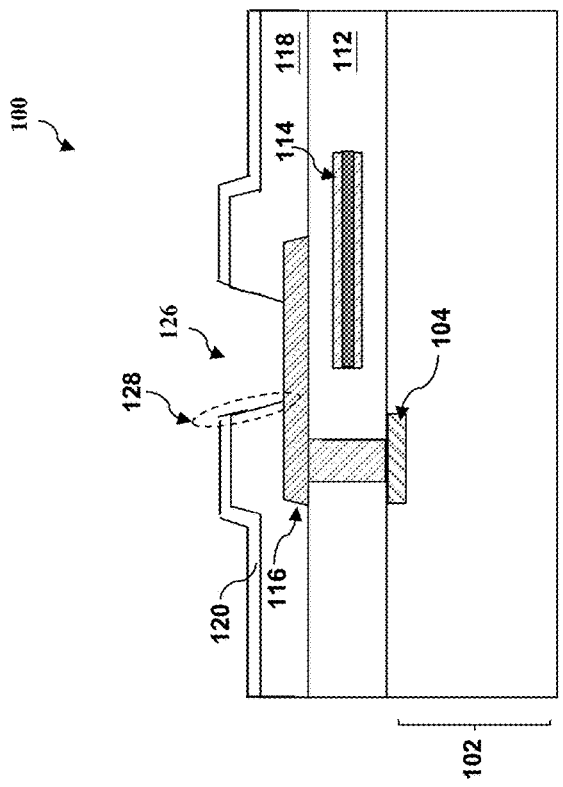
Fig. 3B
Fig. 4
Fig. 3A

SEMICONDUCTOR STRUCTURE WITH POLYIMIDE PACKAGING AND MANUFACTURING METHOD

PRIORITY DATE

This application claims priority to U.S. Provisional Patent Application Ser. No. 62/738,252 filed Sep. 28, 2018, the entire disclosure of which is hereby incorporated herein by reference.

BACKGROUND

In semiconductor industry, integrated circuits (ICs) are formed on a semiconductor substrate and are saw to IC chips. Each IC chip is further attached (such as by bonding) to a circuit board, such as a printed circuit board in electric products. In previous technologies, various bonding pads of the chip are connected to the circuit board through wire bonding. In advanced technologies, a circuit chip is flipped and directly bonded to the circuit board for reduced cost. In this technology, one or more passivation layers are formed to protect the integrated circuits. A redistribution layer of conductive metal lines is formed on the chip to reroute bond connections from the edge to the center of the chip. The redistribution layer is embedded in the passivation layer. Bonding pads are formed on the passivation layer and electrically connect various devices through the redistribution layer and an interconnection structure to form the integrated circuit. The existing packaging structure (including the redistribution layer, the passivation layer and bonding pads) and the corresponding method cause either metal cracking issues (such as during testing, the dicing filling issue and packaging), which further causes packaging defect, circuit failure or reliability concern. Therefore, the present disclosure provides a packaging structure and a method making the same to address the above issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 3A and 3B illustrate sectional views of an IC structure of FIG. 1D, in portion, constructed in accordance with some embodiments.

FIG. 4 is a diagrammatic view of the slope profile for the sidewall surface of the bonding opening in the IC structure of FIG. 3B in accordance with some embodiments.

DETAILED DESCRIPTION

Figure 1B:
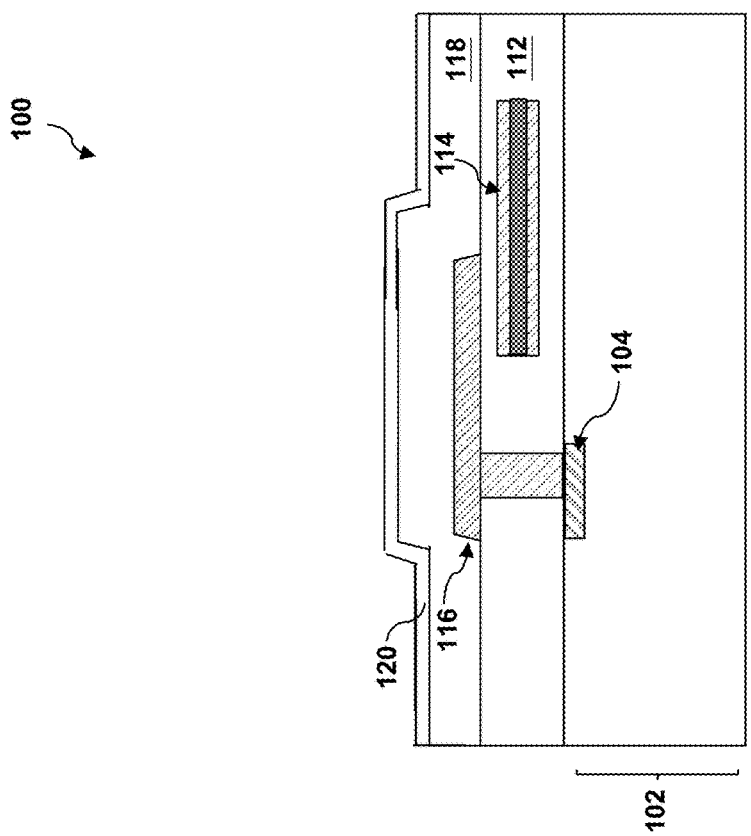
FIGS. 1A, 1B, 1C, 1D and 1E are sectional views of an integrated circuit (IC) structure at various fabrication stages constructed according to various aspects of the present disclosure in some embodiments.

It is to be understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIGS. 1A, 1B, 1C, 1D and 1E are sectional view of an integrated circuit (IC) structure (or a work piece) 100 constructed according to various aspects of the present disclosure in one embodiment. FIG. 2 is a flowchart of a method 200 making the IC structure 100 in accordance with some embodiments. The IC structure 100 and the method 200 making the same are collectively described with reference to FIGS. 1A~1E, 2, and other figures.

Figure 1A:
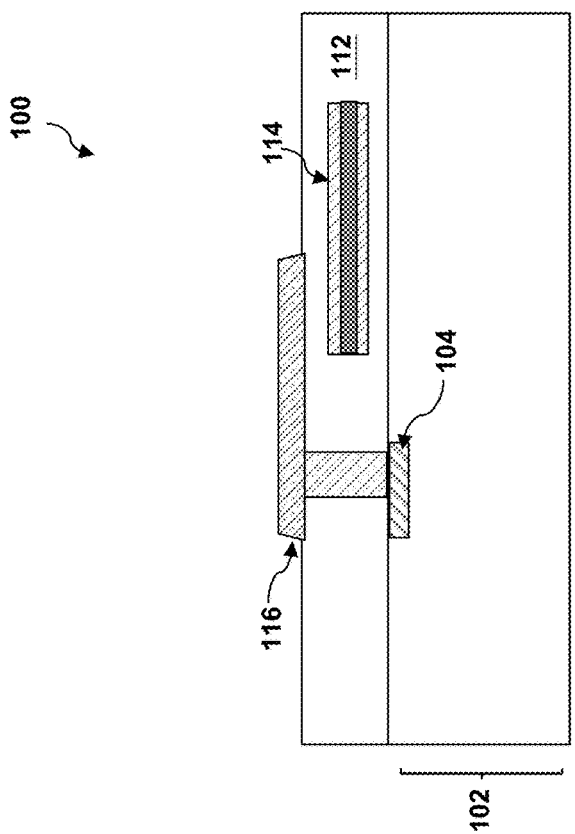
Figure 2:
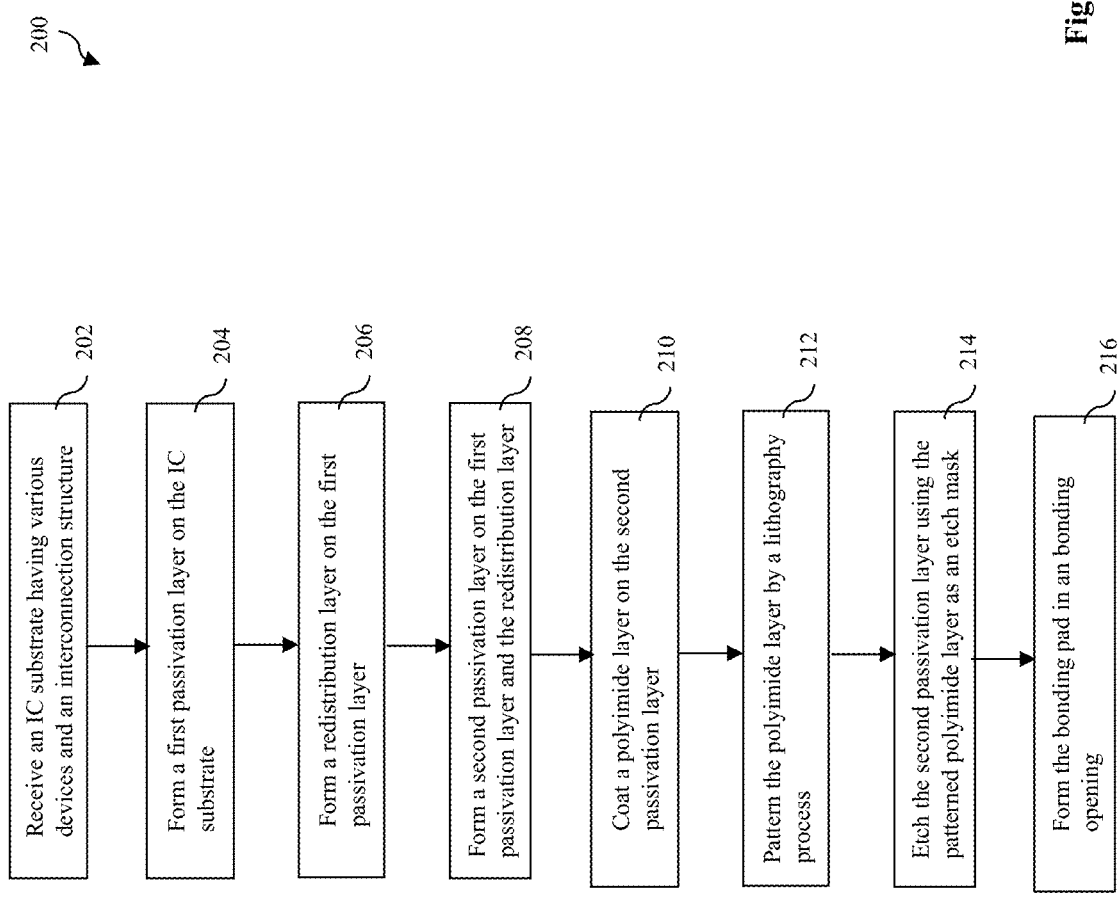
FIG. 2 is a flowchart of a method to fabricate an IC structure of FIG. 1E in accordance with some embodiments.

Referring to FIG. 1A and a block 202 of FIG. 2, the method 200 includes receiving an IC substrate 102 having various devices and an interconnection structure to couple the devices. Particularly, the IC substrate 102 includes a semiconductor substrate, such as a silicon substrate. The IC substrate 102 also includes various devices, such as field-effect transistors (FETs), memory cells, imaging sensors, passive devices, other devices, or combinations thereof. In some embodiments, the IC substrate 102 includes flat active regions with various IC devices, such as plain field-effect transistors (FETs). In some other embodiments, the IC substrate 102 includes fin active regions with various IC devices formed thereon. The IC substrate 102 also includes an interconnection structure formed on the semiconductor substrate and couples the devices into the integrated circuit.

The interconnection structure further includes various conductive features, such as metal lines, contacts and vias, to provide horizontal and vertical routes. The interconnection structure also includes dielectric material for isolation among various conductive features. The metal lines are distributed in multiple metal layers, such as a first metal layer, a second metal layer, . . . and a top metal layer, such as a metal line 104 in the top metal layer.

Referring to FIG. 1A and FIG. 2, the method 200 includes an operation 204 by forming a first passivation layer 112 on the interconnection structure. The first passivation layer 112 is disposed on the top metal layer to provide protection to the IC substrate. In present example, the first passivation layer 112 includes a silicon nitride (SiN) film and an un-doped silica glass (USG) film on the SiN film, disposed by suitable deposition, such as by high density plasma chemical vapor deposition (HDPCVD). In some embodiments, the operation 204 also includes forming one or more capacitor, such as a super high-density metal-insulator-metal (SHD-MIM) capacitor 114, in the first passivation layer 112. The formation of the SHD MIM capacitor 114 includes deposition and patterning process that further includes a lithography process and etching. However, dimensions and non-uniform distribution of the metal plates in the SHD-MIM capacitor 114 may cause cracking, reliability issue and other concerns. The disclosed structure and the method address these concerns.

Still referring to FIG. 1A and FIG. 2, the method 200 includes an operation 206 by forming a redistribution layer (RDL) 116 with various metal traces to redistribute the bonding pads to different locations, such as from the peripheral locations to uniform distribution on chip surface. The RDL 116 couples the interconnection structure to the bonding pads. In the present embodiment, the RDL 116 includes aluminum (Al). The formation of the RDL 116 may include deposition and patterning.

Referring to FIG. 1B and FIG. 2, the method 200 includes an operation 208 by forming a second passivation layer 118 on the RDL 116. In the present embodiment, the second passivation layer 118 may include one USG film and one SiN film on the USG film. The formation of the second passivation layer 118 includes suitable depositions.

Still referring to FIGS. 1B and 2, the method 200 includes an operation 210 by forming a polyimide layer 120 on the second passivation layer 118. The polyimide layer 120 provides protections to the circuit, such as protection from α-particles. The polyimide layer 120 is coated on the second passivation layer 118 by a suitable process, such as spin-on coating. A baking process may be implemented after the spin-on coating. Furthermore, the polyimide layer 120 is designed with desired mechanical characteristics to address the cracking issues and further with manufacturing efficiency. In the present embodiment, the polyimide layer 120, in its final form after coating and patterning, is designed with compositions to have enhanced tensile strength greater than 170 MPa, such as in a range from 170 MPa to 200 MPa; and to have Young's module greater than 4 GPa, such as in a range from 4 GPa to 6 GPa. In furtherance of the embodiment, the polyimide layer 120 includes more than 40% (volume percentage, the same below) aliphatic amide (AA) or Gamma-Butyrolactone (GBL); and more than 25% polyamic acid ester (PAE). In some examples, the polyimide layer 120 includes 50% to 60% AA and 30% to 40% PAE. In some examples, the polyimide includes 40% to 60% GBL and 25% to 35% PAE. The polyimide layer 120 with such composition can achieve the desired mechanical strengths and desired thickness. Furthermore, the polyimide also includes photosensitive chemical such that it can be simply patterned by a lithography process without etch.

Figure 1D:
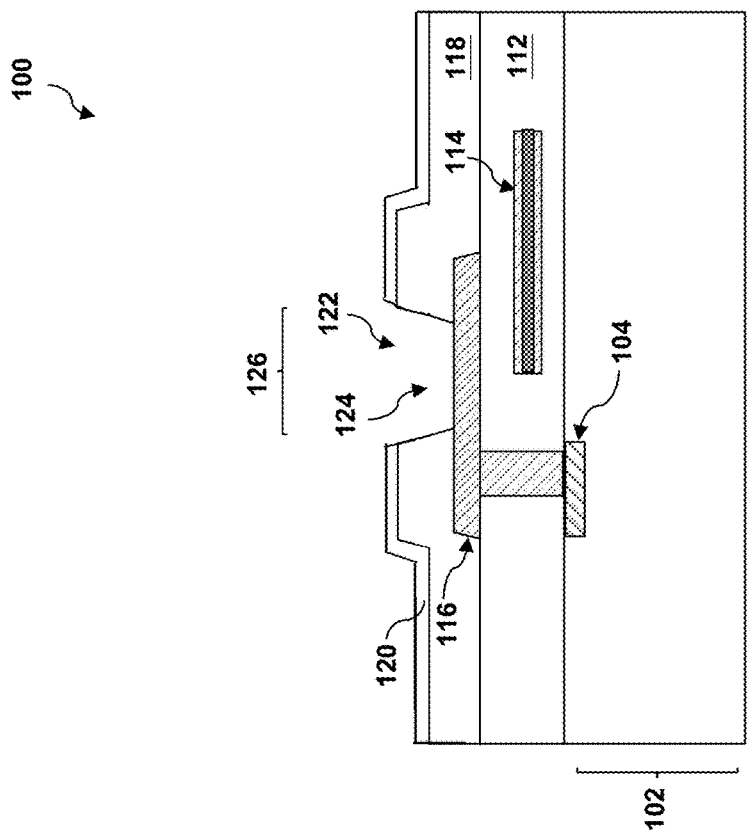
Figure 1C:
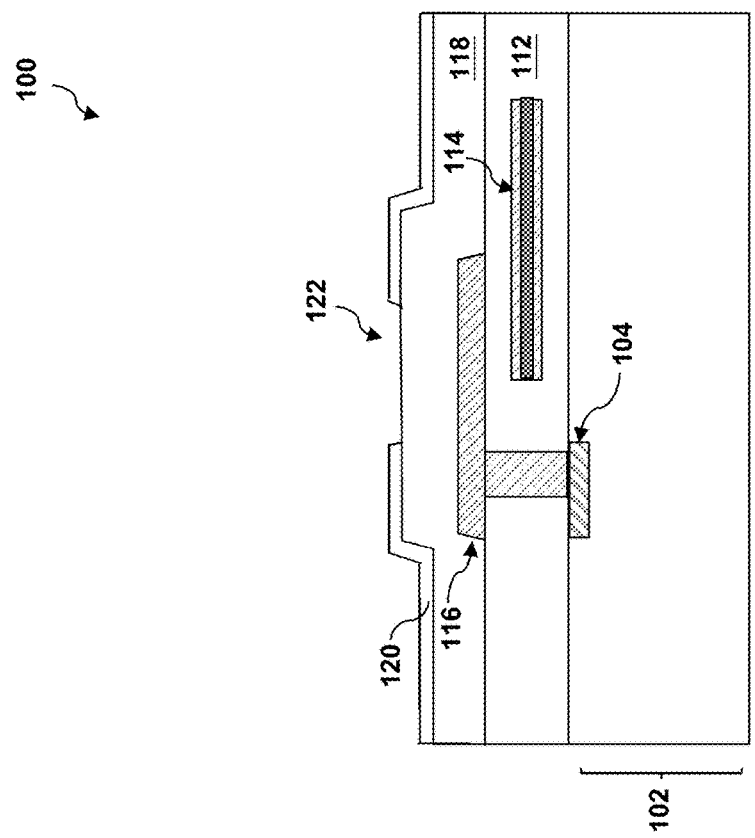

Referring to FIG. 1C and FIG. 2, the method 200 includes an operation 212 to pattern the polyimide layer 120 by a lithography process, thereby forming a patterned polyimide layer 120 having one or more polyimide opening 122 such that the second passivation layer 118 is exposed within the polyimide opening 122. The polyimide layer 120 is simply patterned by a lithography process since it is photosensitive. When it is coated, the polyimide layer 120 includes various compositions as described above, and further includes photosensitive chemical (such as photoacid generator) and solvent (such as aqueous solvent or organic solvent) all mixed together. The polyimide layer 120 undergoes a property change when being exposed to radiation energy, such as ultraviolet (UV) light, deep UV (DUV) light, or extreme UV (EUV) light. This property change can be used to selectively remove exposed portions or alternatively unexposed portions of the polyimide layer by a developing process. This procedure to form a patterned material layer is also referred to as lithography process. Particularly, the lithography process includes an exposure process using a radiation energy (such as UV light) and, thereafter, a developing process using a developing solution to form the patterned polyimide layer. The lithography process may further include other processing steps, such as post-exposure baking (PEB) after the exposure process, and hard baking after the developing process.

Referring to FIG. 1D and FIG. 2, the method 200 includes an operation 214 to pattern the second passivation layer 118 by etch using the patterned polyimide layer 120 as an etch mask. In the operation 214, an etching process is applied to etch the second passivation layer 118 through the polyimide opening 122 of the polyimide layer 120, thereby forming a passivation opening 124 in the second passivation layer 118. Even though the polyimide layer 120 functions as photoresist but is not removed thereafter and remains as a component in the final structure of the IC structure 100. The redistribution layer 116 is exposed within the passivation opening 124. In the operation 214, the passivation opening 124 is transferred from the polyimide opening 122 by the etching process without utilizing a separate lithography process. Therefore, there is no overlay shift between the polyimide opening 122 and the passivation opening 124. Furthermore, the operation 214 eliminates an additional lithography process, which reduces the manufacture cost and increases the throughput. Such formed the polyimide opening 122 and the passivation opening 124 are collectively referred to as a bonding opening 126, as illustrated in FIGS. 3A and 3B. FIG. 3A is a sectional view of the IC structure 100 and FIG. 3B is a sectional view of the IC structure 100, in portion. Especially, the second passivation layer 118 includes a silicon oxide layer 118A and a silicon nitride layer 118B disposed on the silicon oxide layer 118A. The polyimide opening 122 and the passivation opening 124 are collectively referred to as a bonding opening 126. The bonding opening 126 has a sidewall 128 with a continuous sidewall profile due to the etching process using the polyimide layer 120 as an etch mask. The sidewall 128 of the bonding opening 126 has a tapered shape with a greater width at the top and a less width at the bottom. Particularly, the polyimide opening 122 is formed by a lithography process. Due to characteristics of the lithography process in the operation 212, (which includes the exposing process and the developing process), the sidewall surface of the polyimide layer 120 is curved and a varying slope, more particularly, a gradual increasing slope from the bottom to the top. There is an additional portion (also referred to as footing portion) at the bottom of the polyimide layer 120 such that the polyimide opening 122 has a narrower width at the bottom than that at the top. Furthermore, the second passivation layer 118 is formed by etching utilizing the polyimide layer 120 as an etch mask. The corresponding sidewall surface of the passivation opening 124 of the second passivation layer 118 has a substantially constant slope, which is less than the slope of the polyimide layer 120 at the top but is greater than the slope of the polyimide layer 120 at the bottom. Overall, due to characteristics of the etching process in the operation 214 and the lithography process in the operation 212, (which includes the exposing process and the developing process), the slope 400 of the sidewall 128, according to some embodiments, has a turning point at interface between the second passivation layer 118 and the polyimide layer 120, as illustrated in FIG. 4. In FIG. 4, the vertical axis represents the slope and the horizontal axis z represents a distance along the vertical direction from the RDL 216. The slope 400 is substantially flat at a value $S_1$ within the second passivation layer 118, drops to zero at the interface, and increases to a value $S_2$ within the polyimide layer 120, in which $S_2$ is greater $S_1$. The characteristics of the slope 400 is caused by the lithography process and the etching process. Both the continuous sidewall and the tapered shape of the sidewall profile 128 are advantageous to filling various materials of the bonding pad.

Furthermore, with the method 200, the bonding opening 126 gains in the patterning resolution. In an example for illustration, with the disclosed method, the polyimide can be deposited thicker, such as 10 microns (μm) or greater, and be patterned to form a 10 μm opening, which is transferred to the second passivation layer to have an about 10 μm opening. Thus, the final thickness of the polyimide layer 120 is still about 10 μm. In the existing method, the corresponding passivation layer is first patterned by a lithography process and etching. A polyimide layer is thereafter coated and patterned. The polyimide layer is also disposed on the sidewalls of the opening of the corresponding passivation layer. Assuming if the opening in the corresponding passivation layer is 20 μm in size, the polyimide layer can only deposit 5 μm thick to have a 10 μm open, leaving the polyimide layer with a less and limited thickness.

Figure 1F:
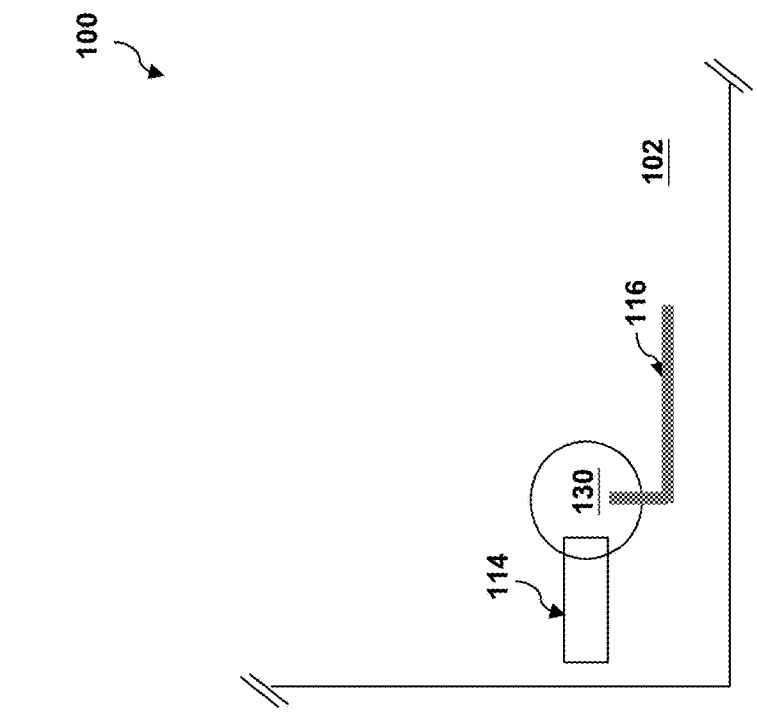
FIG. 1F is a top view of the IC structure of FIG. 1E, in portion, constructed according to various aspects of the present disclosure in some embodiments.
Figure 1E:
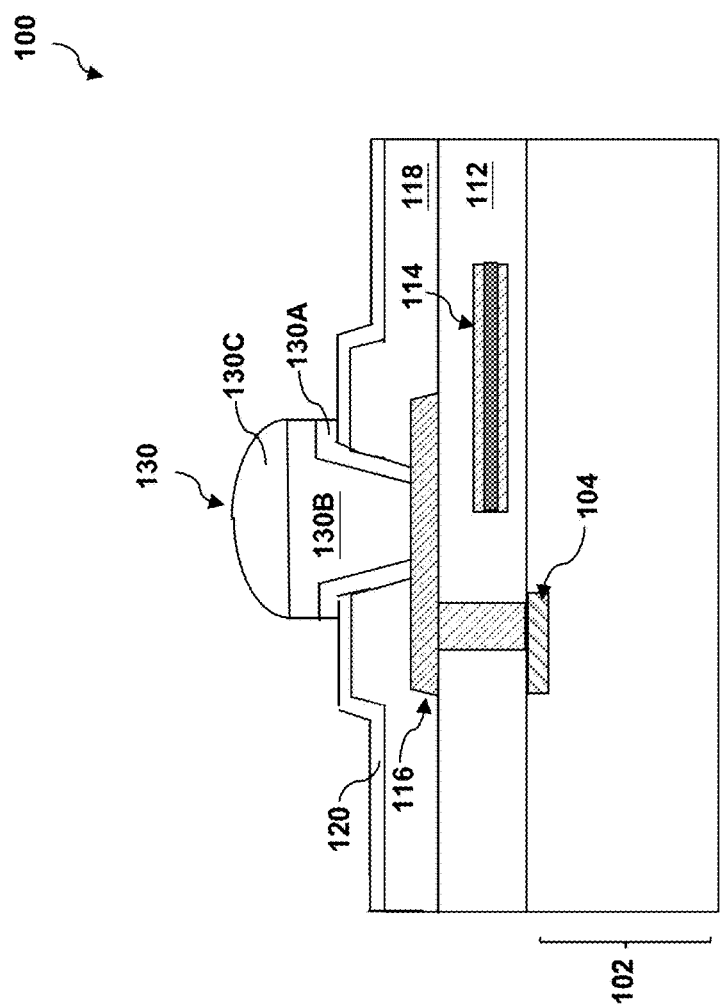

Referring to FIGS. 1E and 2, the method 200 includes an operation 216 to form a bonding pad 130 in the bonding opening 126. The formation of the bonding pad 130 includes depositing various conductive materials to fill in the bonding opening 126 using suitable deposition technique. In some embodiment, the bonding pad 130 includes under bump metallization (UBM) 130A, a copper layer 130B, and solder 130C, as illustrated in FIG. 1E. In some embodiments, the copper layer 130B of the bonding pad 130 includes a flat top surface with the solder layer formed thereover, and a funnel-shaped bottom portion directly contacting the UBM layer 130A and the horizontal portion of the redistribution layer 116. In some embodiments, the copper layer 130B contacts the horizontal portion of the redistribution layer 116 in the passivation opening.

FIG. 1F is a top view of the IC structure 100, in portion, constructed in accordance with some embodiments. Especially, FIG. 1F only illustrates a corner portion of the IC structure 100, which is usually referred to as chip corner. The bonding pad 130 is disposed on an edge of the IC structure 100. The SHE-MIM capacitor 114 is disposed at the edge of the IC structure 100 as well and is overlapped with the bonding pad 130.

In the present embodiment, the SHD-MIM capacitor 114 is disposed at a chip corner, overlapped with the bonding pad 130, and is extended from the bonding pad 130 to the chip corner. The redistribution layer 116 is L-shaped in the top view of the IC structure 100. The L-shaped redistribution layer 116 includes multiple segments such as, for example, two ends extends to two different directions from a shared point. One of the two ends partially overlaps with the bonding pad 130, while the other end extends away from the chip corner. As noted above, dimensions and non-uniform distribution of the metal plates in the SHD-MIM capacitor 114 may cause cracking, reliability issue and other concerns around the edges of the bonding pad 130. The present disclosure addresses these concerns through the disclosed IC structure 100 and the method 200.

Figure 5A:
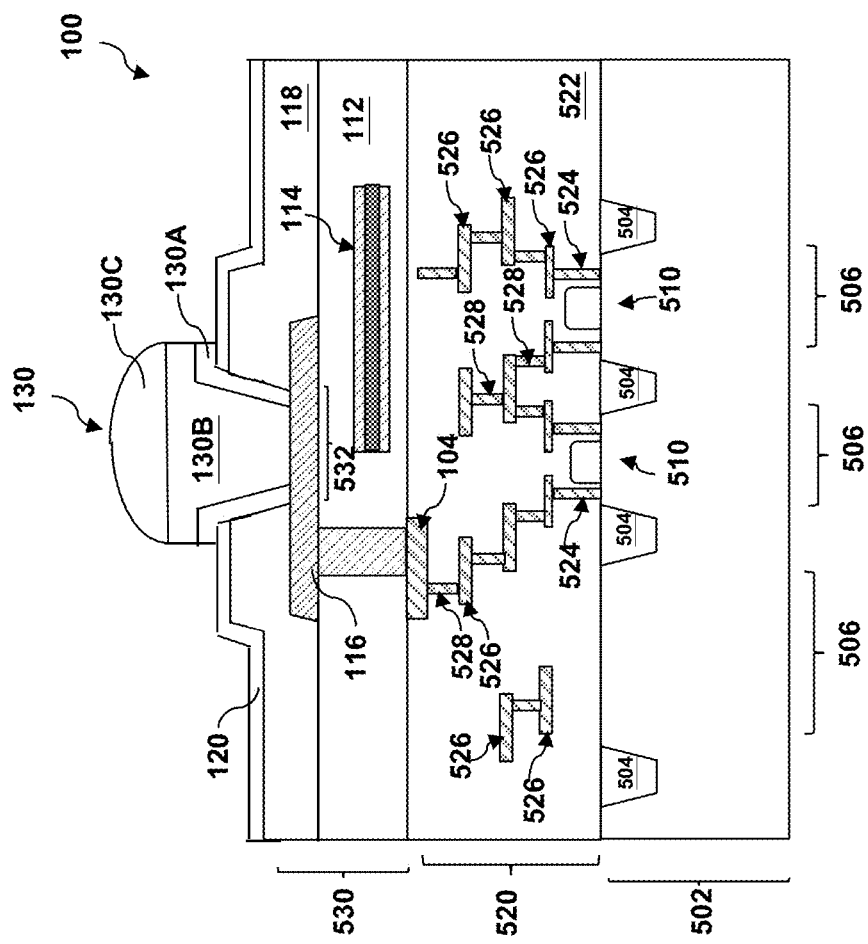
FIGS. 5A and 5B are sectional views of an IC structure constructed according to various aspects of the present disclosure in various embodiments.
Figure 5B:
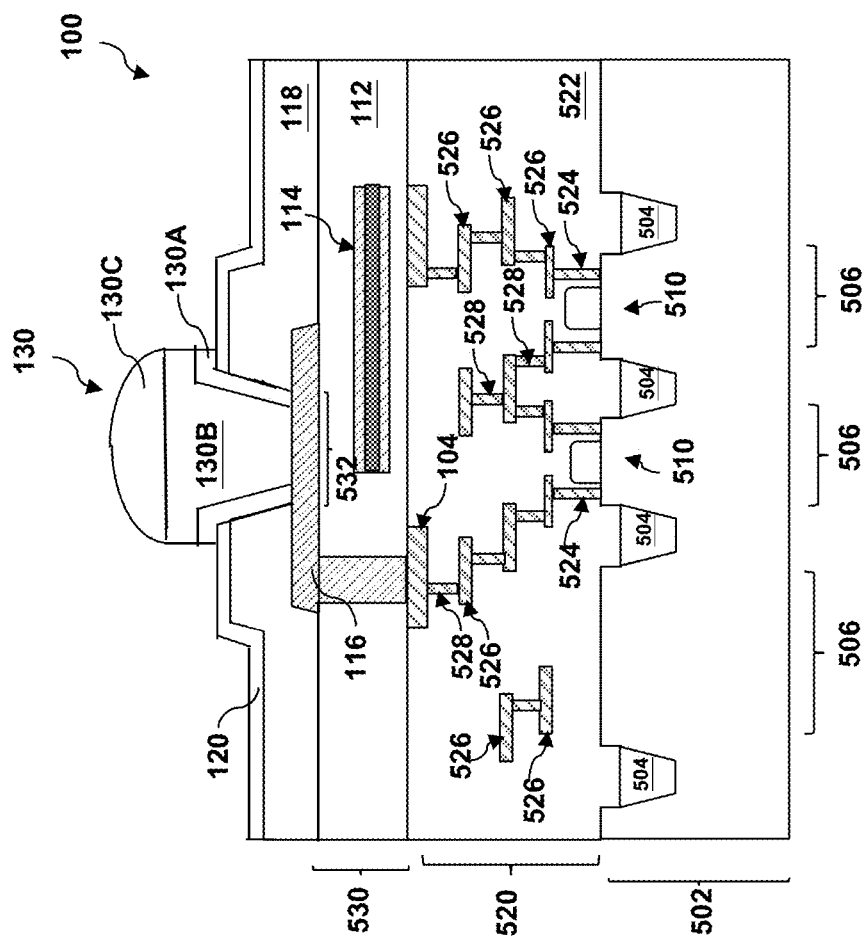

FIG. 5A is a sectional view of an IC structure 100 with flat active region constructed according to some embodiments. FIG. 5B is a sectional view of the IC structure 100 with fin active regions constructed according to some other embodiments. In some embodiments, the IC structure 100 includes flat active regions with various IC devices, such as plain field-effect transistors (FETs), formed thereon, as illustrated in FIG. 5A. In some embodiments, the IC structure 100 includes fin active regions with various IC devices formed thereon, as illustrated in FIG. 5B.

The IC structure 100 includes a substrate 502. The substrate 502 includes a bulk silicon substrate. Alternatively, the substrate 502 may include an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible substrate 502 also includes a silicon-on-insulator (SOI) substrate. SOI substrates are fabricated using separation by implantation of oxygen (SIMOX), wafer bonding, and/or other suitable methods.

The substrate 502 also includes various isolation features, such as shallow trench isolation (STI) features 504 formed on the substrate 502 and defining various active regions 506 on the substrate 502. The STI features 504 define and electrically isolate the active regions 506 from each other. The STI features 504 include one or more dielectric material, such as silicon oxide, silicon nitride, silicon oxynitride, other suitable dielectric materials, or combinations thereof. The STI features 504 are formed by any suitable process. As one example, the formation of the STI features 504 includes a lithography process to expose a portion of the substrate, etching a trench in the exposed portion of the substrate (for example, by using a dry etching and/or wet etching), filling the trench (for example, by using a chemical vapor deposition process) with one or more dielectric materials, and planarizing the substrate and removing excessive portions of the dielectric material(s) by a polishing process, such as a chemical mechanical polishing (CMP) process. In some examples, the filled trench may have a multi-layer structure, such as a thermal oxide liner layer and filling layer(s) of silicon nitride or silicon oxide.

The active regions 506 are regions with semiconductor surface wherein various doped features are formed and configured to one or more device, such as a diode, a transistor, and/or other suitable devices. The active regions 506 may include a semiconductor material similar to that of the bulk semiconductor material (such as silicon) of the substrate 502 or a different semiconductor material, such as silicon germanium (SiGe), silicon carbide (SiC), or multiple semiconductor material layers (such as alternative silicon and silicon germanium layers) formed on the substrate 502 by epitaxial growth, for performance enhancement, such as strain effect to increase carrier mobility.

In some embodiments illustrated in FIG. 5B, the active region 506 is three-dimensional, such as a fin active region extended above the isolation feature 504, for more effective coupling between the channel region (or simply referred to as channel) and the gate electrode of a FET. The fin active regions may be formed by selective etching to recess the isolation features 504, or selective epitaxial growth to grow active regions with a semiconductor same or different from that of the substrate 502, or a combination thereof.

The substrate 502 further includes various doped features, such as n-type doped wells, p-type doped wells, source and drain, other doped features, or a combination thereof configured to form various devices or components of the devices. The IC structure 100 includes various IC devices 510 formed on the substrate 502. The IC devices 510 include fin field-effect transistors (FinFETs), diodes, bipolar transistors, imaging sensors, resistors, capacitors, inductors, memory cells, or a combination thereof.

The IC structure 100 further includes an interconnection structure 520 formed on the substrate 502. The interconnection structure 520 includes various conductive features to couple the IC devices 510 into an integrated circuit; and an interlayer dielectric (ILD) layer 522 to separate and isolate the conductive features. The interconnection structure 520 includes contacts 524; metal lines 526; and vias 528. The metal lines 526 are distributed in multiple metal layers. In FIG. 5A and FIG. 5B, four metal layers are illustrated. The top metal lines are separately labeled with numerical 104. The contacts 524 provide vertical electrical routing from the substrate 502 to the metal lines. The vias 528 provide vertical electrical routing between adjacent metal layers. Various conductive features are formed by one or more conductive material, such as metal, metal alloy, or silicide. For examples, the metal lines 526 may include copper, aluminum copper alloy, other suitable conductive material, or a combination thereof. The vias 528 may include copper, aluminum copper alloy, other suitable conductive material, or a combination thereof. The contacts 524 may include tungsten, silicide, nickel, cobalt, copper, other suitable conductive material, or a combination thereof. In some examples, various conductive features may further include a barrier layer, such as tantalum/tantalum nitride, or titanium/titanium nitride. In the present embodiment, the top metal lines 104 include copper.

The ILD layer 522 includes one or more dielectric material to provide isolation functions to various device components (such as gates) and various conductive features (such as metal lines, contacts and vias). The ILD layer 522 includes a dielectric material, such as silicon oxide, a low-k dielectric material, other suitable dielectric material, or a combination thereof. In some examples, the low-k dielectric material includes fluorinated silica glass (FSG), carbon doped silicon oxide, Aerogel, amorphous fluorinated carbon, polyimide, and/or other suitable dielectric materials with dielectric constant substantially less than that of the thermal silicon oxide. The formation of the ILD layer 522 includes deposition and CMP, for examples. The deposition may include spin-on coating, chemical vapor deposition (CVD), other suitable deposition technology or a combination thereof. The ILD layer 522 may include multiple layers and is collectively formed with conductive features in a proper procedure, such as damascene process.

In some embodiments, the interconnection structure 520 or a portion thereof is formed by deposition and patterning. For examples, a metal (or metal alloy), such as aluminum copper alloy is deposited by physical vapor deposition (PVD), and then is patterned by lithography process and etching. Then an ILD layer is disposed on by deposition (and CMP). In alternative embodiments, the interconnect structure 520 is formed by a damascene process. In a damascene process, an ILD layer is deposited, may be further planarized by CMP, and then is patterned by lithography and etching to form trenches. One or more conductive material is deposited to fill the trenches, and another CMP process is applied to remove the excessive conductive material and planarize the top surface, thereby forming conductive features. The damascene process may be used to form metal lines, vias, and contacts. A dual damascene process may be applied to form one layer of metal lines and vias underlying the metal lines. In this case, the ILD layer is deposited and patterned twice to form trenches and via holes, respectively. Then the metal is deposited to fill both the trenches and via holes to form metal lines and vias.

The IC structure 100 further includes a passivation structure 530 disposed on the interconnection structure 520. The passivation structure 530 includes passivation material and a RDL embedded in the passivation. The passivation structure 530 includes a RDL 116 to redistribute bonding pads, such as redistributing from the edge to the center of an IC chip for flip chip bonding or other suitable packaging technology to integrate an IC chip to a board (e.g., a printed circuit board). The RDL 116 includes conductive features and may include more than one conductive layer. In the present embodiment, the RDL 116 includes a vertical portion to connecting to the top metal line 104 and a horizontal portion to redistribute and to connect the bonding pad.

The passivation structure 530 includes one or more passivation layers to seal the integrated circuit from the environment contamination and other damages. In the present embodiment, the passivation structure 530 includes a first passivation layer 112 and a second passivation layer 118 disposed on the first passivation layer 112. The first passivation layer 112 includes a redistribution via (RV) aligned to a top metal line 104 so that a vertical portion of the RDL 116 is formed in the RV and directly contacts the top metal line 104. The second passivation layer 118 also includes one opening to expose the RDL 116 as a bonding area 532. The RDL 116 vertically extends from the first passivation layer 112 to the second passivation layer 118, and horizontally extends to a bonding area 532 for bonding pad redistribution.

In the present embodiment, the first passivation layer 112 includes a silicon nitride (SiN) layer and an USG layer on the SiN layer; and the second passivation layer 118 includes an USG layer and a SiN layer disposed on the USG layer. The RDL 116 may include multiple layers. In the present embodiment, the RDL 116 includes a barrier layer, a diffusion layer disposed on the barrier layer and an aluminum copper alloy layer disposed on the diffusion layer. The barrier layer may further include a tantalum film and a tantalum nitride film disposed on the tantalum film. The diffusion layer is a metal oxide. In the present embodiment, the diffusion layer includes tantalum, oxygen, aluminum, and nitrogen. The diffusion layer may have a thickness ranging between 5 Angstrom and 30 Angstrom. The aluminum copper alloy layer may be deposited at a high temperature greater than 300° C.

In some embodiments, the semiconductor structure 100 also includes one or more SHD-MIM capacitor 114 formed in the first passivation layer 112, and configured as those described in FIG. 1F.

The IC structure 100 includes a polyimide layer 120 disposed on the second passivation layer 118 and is patterned to have an opening that defines the bonding area 532. Especially, the polyimide layer 120 is photosensitive and is patterned by a lithography process without etching. Furthermore, the second passivation layer 118 is patterned by etch using the patterned polyimide layer 120 as an etching mask.

The IC structure 100 also includes a bonding pad 130 disposed on the RDL 116 in the bonding area 532. In the present embodiment, the bonding pad 130 includes various conductive materials, such as under bump metallization (UBM) 130A, a copper layer 130B and solder 130C. The UBM 130A provides a low resistance electrical connection to the RDL, adheres to the RDL and the passivation, hermetically seals, and prevents diffusion of other bump metals into the IC. The UBM includes multiple layers of different metals such as an adhesion layer (e.g., Ti, Cr, Al or a combination thereof), a diffusion barrier layer (e.g., CrCu alloy), a solderable layer, and an oxidation barrier layer (e.g., Au).

Figure 6:
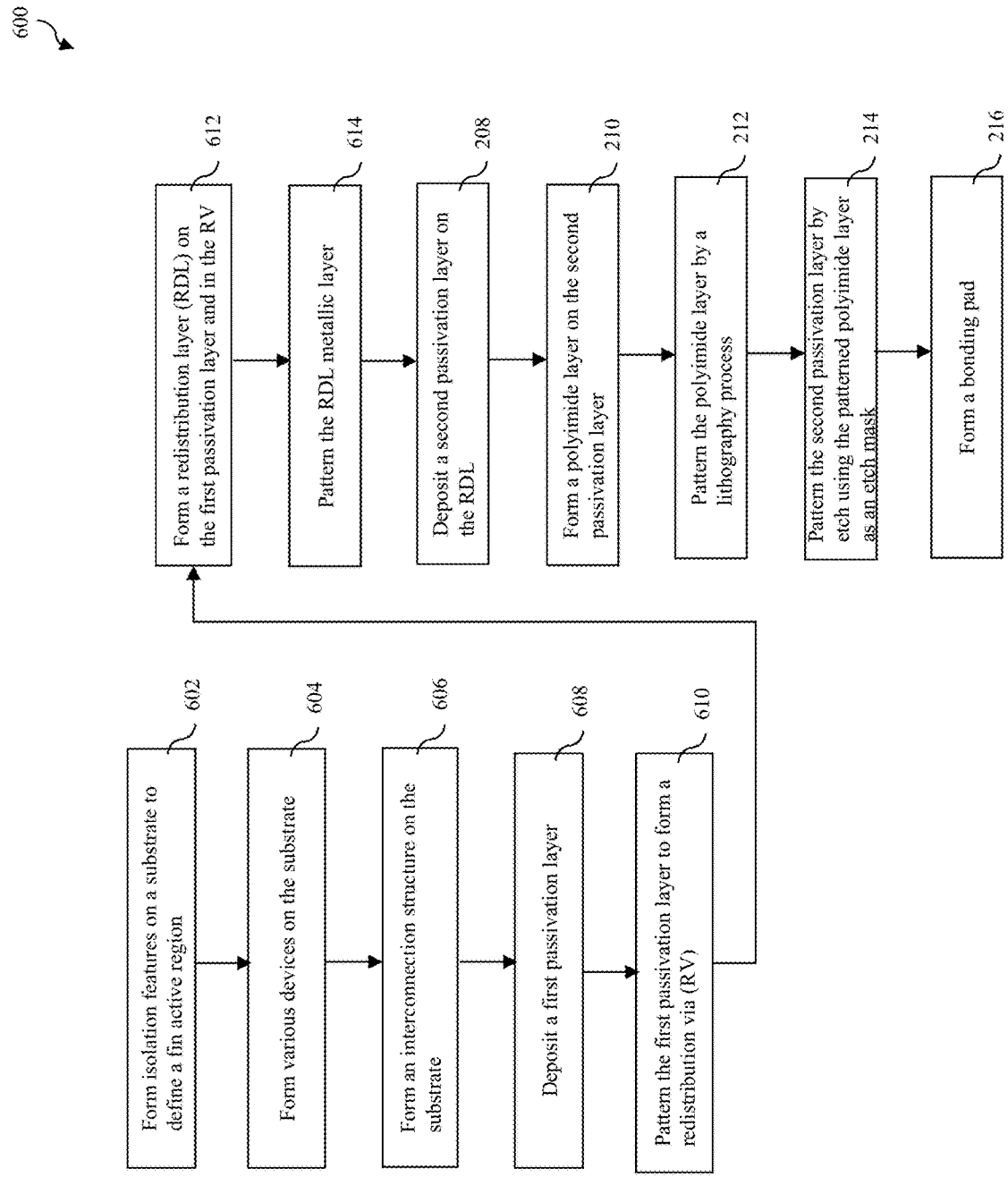
FIG. 6 is a flowchart of a method to fabricate the IC structure of FIGS. 5A (and 5B) in accordance with some embodiments.

FIG. 6 is a flowchart of a method 600 making the IC structure 100 in accordance with some embodiments. FIGS. 7~11 are sectional views of the IC structure 100 of FIG. 5A at various fabrication stages. The IC structure 100 and the method 600 making the same are collectively described with reference to FIGS. 6~11 and other figures. Even though the method 600 is described with only the IC structure 100 of FIG. 5A with flat active regions, it is understood that the method 600 is also applicable to form the IC structure 100 of FIG. 5B with fin active regions. Some fabrication details are provided above and are not repeated here.

Figure 7:
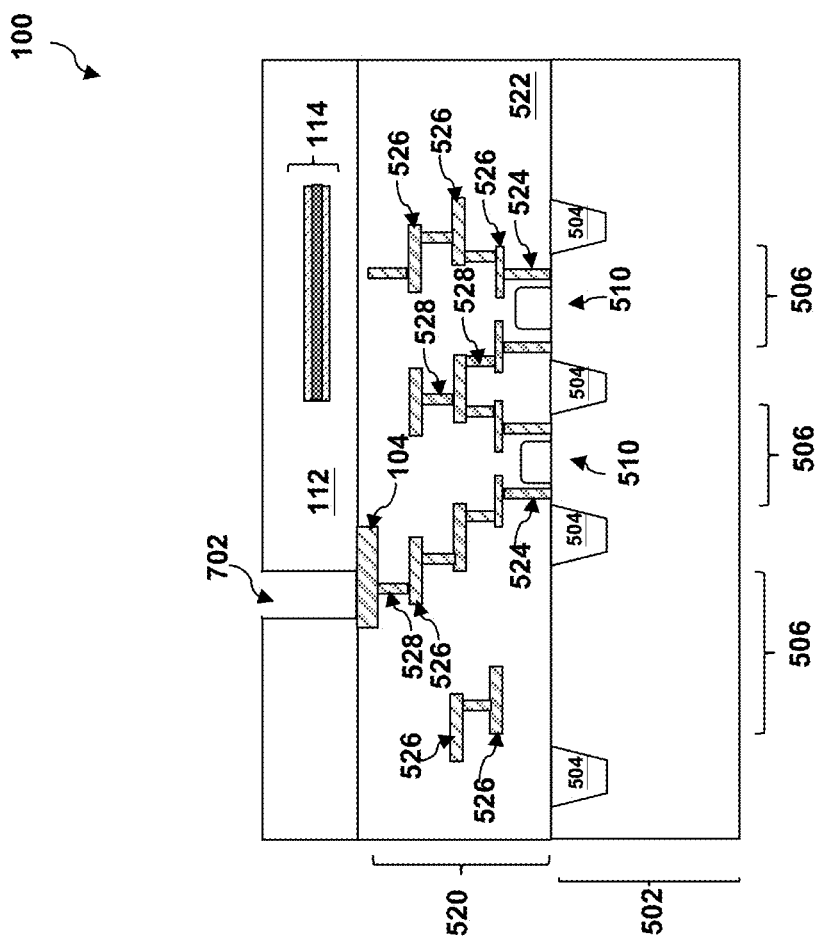
FIGS. 7, 8, 9, 10 and 11 illustrate sectional views of the IC structure at various fabrication stages and made by the method of FIG. 6, constructed in accordance with some embodiments.

Referring to FIG. 7, the method 600 includes an operation 602 to form isolation features 504 on a substrate 502; an operation 604 to form various IC devices 510 (such as FETs, diodes, passive devices, imaging sensors, memory cells, other suitable IC devices or a combination thereof) on the substrate 502; and an operation 606 to form an interconnection structure 520 (such as contacts 524, metal lines 526, vias 528 and top metal lines 104) by a suitable method, such as damascene process.

The method 600 further includes an operation 608 to deposit a first passivation layer 112 on the interconnection structure 520. The first passivation layer 112 includes one or more dielectric material layers. In the present embodiment, the first passivation layer 112 includes a first dielectric material layer and a second dielectric material layer disposed on the first dielectric material layer. In furtherance of the embodiment, the first dielectric material layer includes SiN and has a thickness ranging between 500 Angstrom and 1000 Angstrom; and the second dielectric material layer includes a USG layer and has a thickness ranging between 5000 Angstrom and 10000 Angstrom. The first passivation layer 112 is deposited by a suitable deposition technology, such as CVD, HDPCVD, other suitable technology or a combination thereof. The operation 608 may include multiple steps to deposit different dielectric material layers with respective precursors.

In some embodiments, the operation 608 also include forming one more capacitors, such as a SHD-MIM capacitor 114, in the first passivation layer 112. The SHD-MIM capacitor 114 includes two electrodes and an insulator material layer sandwiched between the two electrodes. The formation of the SHD-MIM capacitor 114 includes deposition of various materials and patterning. For example, an USG film is deposited, the SHD-MIM capacitor 114 is formed by deposition and patterning, and then another USG film is deposition. As the SHD-MIM capacitor 114 is present in the semiconductor structure 100, the IC structure 100 may have reliability concerns, such as metal cracking issues. The method 600 address these concerns.

The method 600 includes an operation 610 to pattern the first passivation layer 112 to form a redistribution via (RV) 702, which is aligned with a top metal line 104 so that the respective top metal line 104 is exposed within the RV 702. In some embodiments, a RV 702 has a dimension ranging between 5 µm and 20 µm. The patterning process in the operation 610 includes lithography process and etching. In some examples, a patterned photoresist layer is formed by lithography process. An etching process is applied to the first passivation layer 112 through openings of the patterned photoresist layer to form RV 702 in the first passivation layer 112. The etching process may include dry etching, wet etching, or a combination thereof. The etching process may include multiple etching steps with different etchants to etch respective dielectric material layers. For example, the etching process may include a first etching process using buffered hydrofluoric acid to etch the USG layer and phosphoric acid to etch the SiN layer of the first passivation layer 112. In some examples, the operation 610 may uses a patterned hard mask to define the region for the RV 702. The formation of the patterned hard mask may include depositing a hard mask layer; forming a patterned resist layer by a lithography process; etching the hard mask through the openings of the patterned resist layer; and removing the patterned resist layer by wet stripping or plasma ashing.

Figure 8:
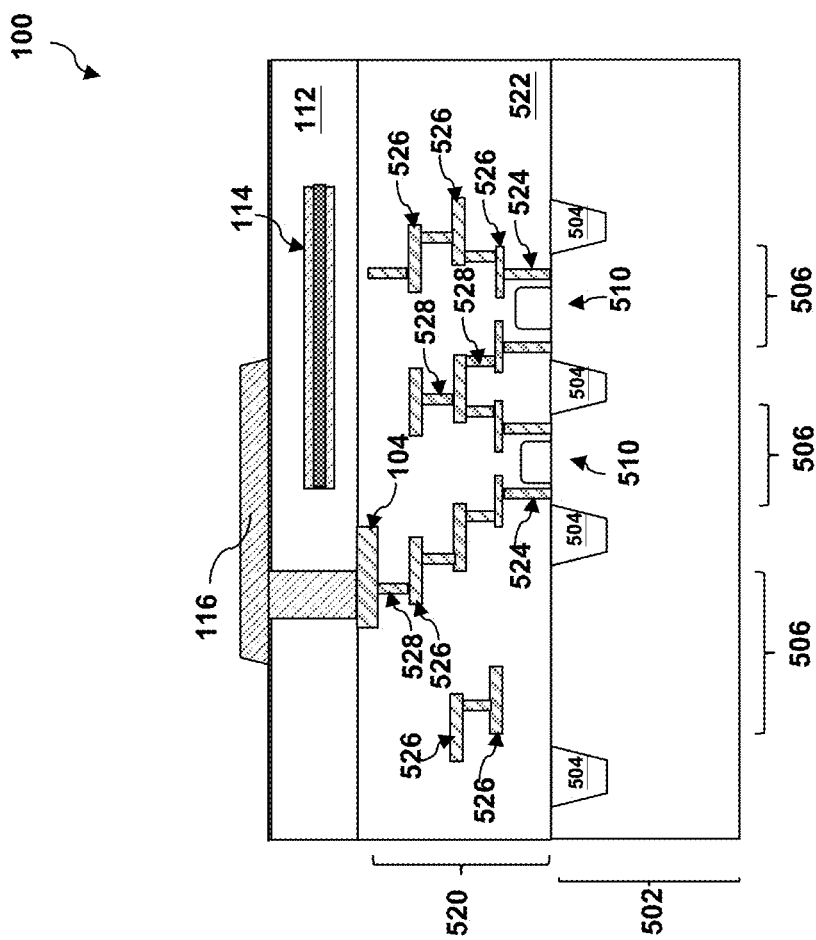

Referring to FIG. 8, the method 600 includes an operation 612 to form a RDL 116 on the first passivation layer 112 and on the top metal line 104 within the RV 702. The RDL 116 includes one or more conductive material, such as aluminum. The RDL 116 directly contacts the top metal line 104 through the RV 702. The RDL 116 may include multiple films formed by multiple steps.

Still referring to FIG. 8, the method 600 proceeds to an operation 614 by patterning the RDL 116 by lithography process and etching. The etching process may include dry etching, wet etching, or a combination thereof. The etching process may include multiple etching steps with different etchants to etch respective films in the RDL 116. In some examples, the operation 614 may uses a hard mask to pattern the RDL 116. After the completion of the operation 614, the RDL 116 is formed on the first passivation layer 112. The RDL 116 includes a vertical feature that extends to and directly contact the respective top metal line 104.

Figure 9:
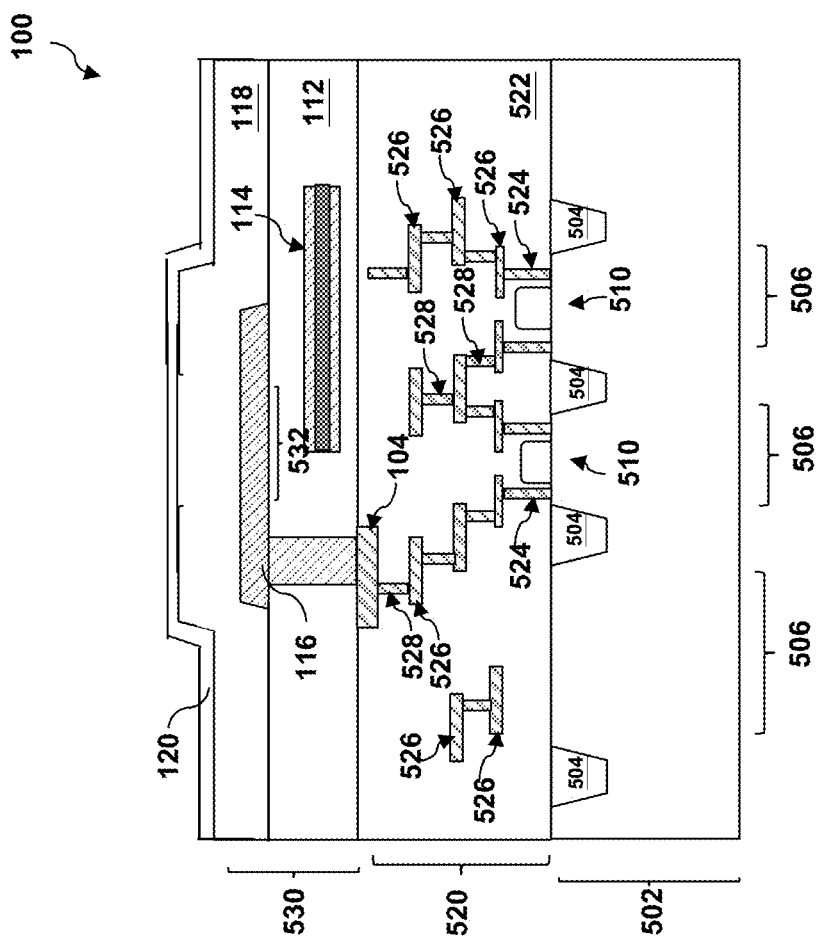

Referring to FIG. 9, the method 600 includes an operation 208 to deposit a second passivation layer 118 on the first passivation layer 112 and the RDL 116. The second passivation layer 118 includes one or more dielectric material layers. In the present embodiment, the second passivation layer 118 includes a first dielectric material layer and a second dielectric material layer disposed on the first dielectric material layer. In furtherance of the embodiment, the first dielectric material layer includes USG and has a thickness ranging between 2000 Angstrom and 4000 Angstrom; and the second dielectric material layer includes SiN and has a thickness ranging between 2000 Angstrom and 6000 Angstrom. The second passivation layer 118 is deposited by a suitable deposition technology, such as HDPCVD, other suitable technology or a combination thereof. The operation 208 may include multiple steps to deposit different dielectric material layer with respective precursors.

Still referring to FIG. 9, the method 600 includes an operation 210 to deposit a polyimide layer 120 on the second passivation layer 118. In the present embodiment, the polyimide layer 120 is disposed on the second passivation layer 118 by spin-on coating. A baking process may be implemented after the spin-on coating. The polyimide layer 120 is designed with desired mechanical characteristics to address the cracking issues. In the present embodiment, the polyimide layer 120 is designed with compositions to have enhanced tensile strength greater than 170 MPa, such as in a range from 170 MPa to 200 MPa; and to have Young's module greater than 4 GPa, such as in a range from 4 GPa to 6 GPa. In furtherance of the embodiment, the polyimide layer 120 includes more than 40% aliphatic amide (AA) or Gamma-Butyrolactone (GBL); and more than 25% polyamic acid ester (PAE). In some examples, the polyimide layer 120 includes 50% to 60% AA and 30% to 40% PAE. In some examples, the polyimide layer 120 includes 40% to 60% GBL and 25% to 35% PAE. The polyimide layer 120 with such composition can achieve desired mechanical strengths and desired thickness. Furthermore, the polyimide layer 120 also includes photosensitive chemical such that it can be patterned only by a lithography process without etching, therefore reducing the manufacturing cost.

Figure 10:
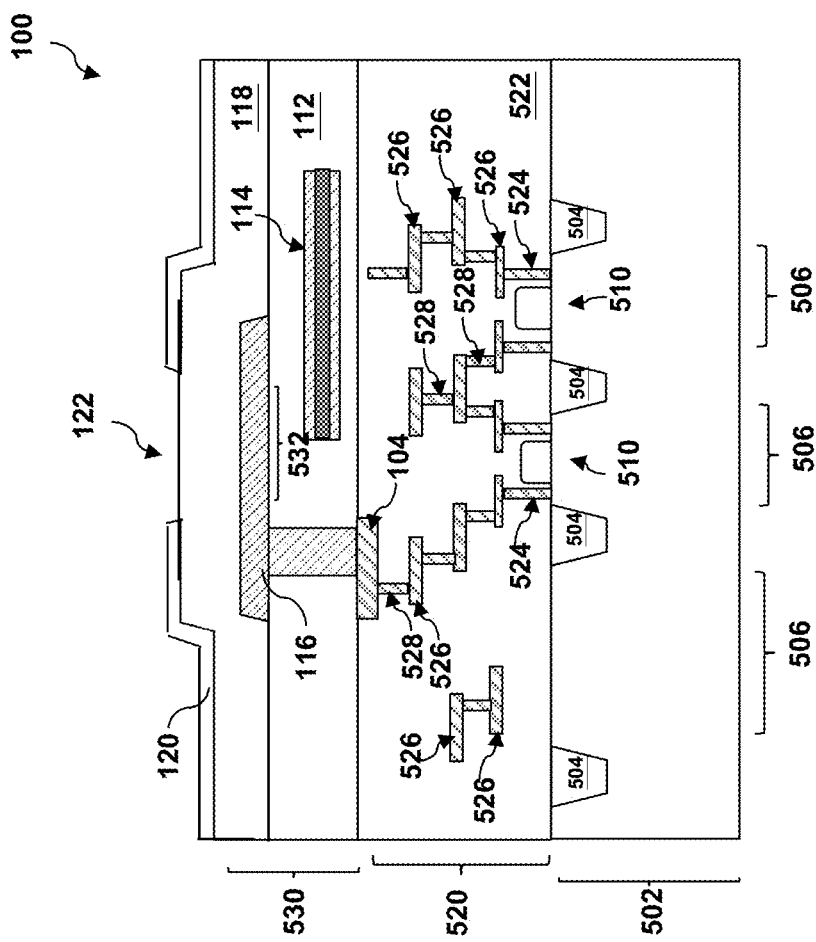

Referring to FIG. 10, the method 600 includes an operation 212 to pattern the polyimide layer 120 by a lithography process, thereby forming a patterned polyimide layer 120 having one or more polyimide opening 122 such that the second passivation layer 118 is exposed within the polyimide opening 122. The polyimide layer 120 is directly patterned by a lithography process since the polyimide is photosensitive. When it coated, the polyimide layer 120 includes polyimide with compositions described as above; photosensitive chemical (such as photoacid generator); and solvent (such as aqueous solvent or organic solvent) mixed together. Particularly, the lithography process includes an exposure process using the radiation energy; and thereafter, a developing process using a developing solution to form the patterned polyimide layer 120. The lithography process may further include other processing steps, such as PEB and hard baking.

Figure 11:
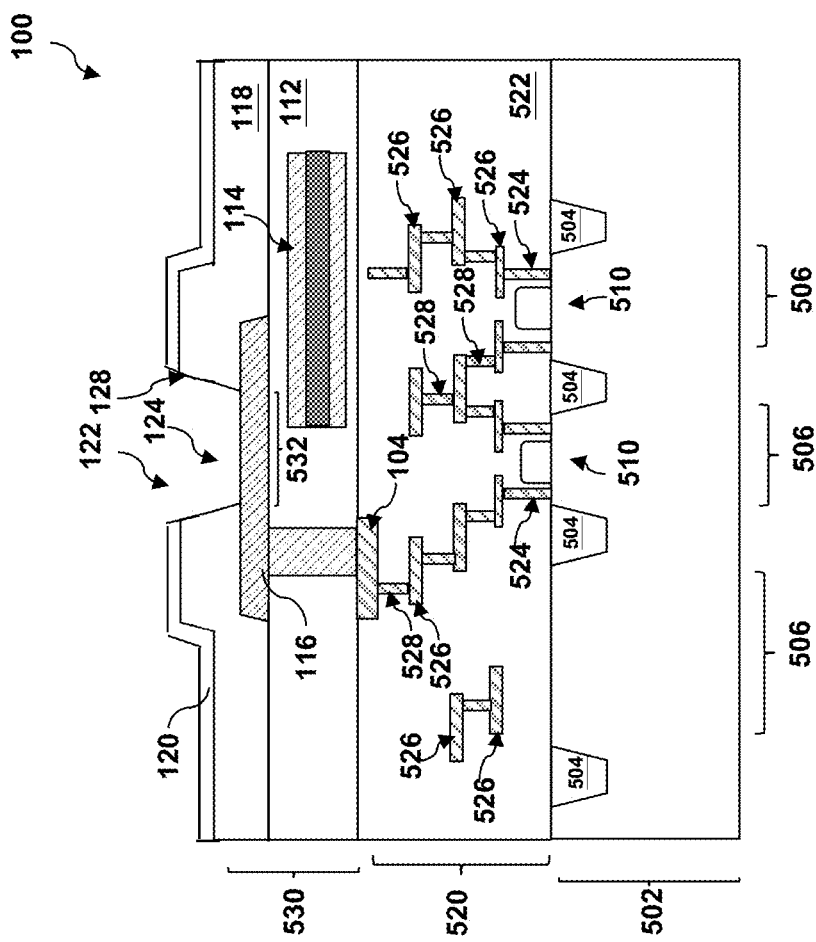

Referring to FIG. 11, the method 600 includes an operation 214 to pattern the second passivation layer 118 to form a passivation opening 124 in the bonding area 532 such that the RDL 116 is exposed in the bonding area 532. The operation 214 includes an etch process to etch the second passivation layer 118 using the patterned polyimide layer 120 as an etch mask. In the operation 214, the etching process is applied to etch the second passivation layer 118 through the polyimide opening 122, thereby forming the passivation opening 124 in the second passivation layer 118. In the operation 214, the passivation opening 124 is transferred from the polyimide opening 122 by the etching process without utilizing a separate lithography process. Therefore, there is no overlay shift between the polyimide opening 122 and the passivation opening 124. Furthermore, the operation 214 eliminates a lithography process, reducing the manufacture cost and increasing the throughput. Such formed the polyimide opening 122 and the passivation opening 124 (collectively referred to as a bonding opening) include a continuous sidewall profile 128. The bonding opening has a tapered shape with greater a width at the top and a less width at the bottom due to the lateral etching effect of the etching process. Both the continuous sidewall and the tapered shape of the sidewall profile are advantageous to filling various materials of the bonding pad. Furthermore, with the method 600, the bonding opening gains on thickness under given size of the bonding opening.

Referring to FIG. 5A (or 5B), the method 600 includes an operation 216 to form a bonding pad 130 in the bonding opening 126. The formation of the bonding pad 130 includes filling various conductive materials in the bonding opening using suitable deposition technique. In some embodiment, the bonding pad 130 includes under bump metallization (UBM) 130A, a copper layer 130B and solder 130C. The method 600 may additionally include other operations before, during or after the operations described above.

The present disclosure provides a semiconductor structure 100 and a method (200 or 600) making the same in various embodiments. The semiconductor structure includes a polyimide layer with designed composition for mechanical characteristics and other functions. The polyimide layer is patterned only by a lithography process. The second passivation layer is patterned only by etch using the patterned polyimide layer as an etch mask. By implementing the disclosed method in various embodiments, some of advantages described below may present. However, it is understood that different embodiments disclosed herein offer different advantages and that no particular advantage is necessarily required in all embodiments. As one example, there is no overlay shift between the polyimide opening 122 and the passivation opening 124. Furthermore, the patterning of the second passivation layer eliminates an additional lithography process, reducing the manufacture cost and increasing the throughput. Such formed the polyimide opening 122 and the passivation opening 124 include a continuous and tapered sidewall profile, improving the formation of the bonding pad 130.

Thus, the present disclosure provides an integrated circuit (IC) structure in accordance with some embodiments. The IC structure includes providing an integrated circuit (IC) substrate having various devices and an interconnection structure that couples the devices to an integrated circuit; forming a first passivation layer on the IC substrate; forming a redistribution layer on the first passivation layer, the redistribution layer being electrically connected to the interconnection structure; forming a second passivation layer on the redistribution layer and the first passivation layer; forming a polyimide layer on the second passivation layer; patterning the polyimide layer, resulting in a polyimide opening in the polyimide layer; and etching the second passivation layer through the polyimide opening using the polyimide layer as an etch mask.

The present disclosure also provides method making an IC structure in accordance with some other embodiments. The method includes providing an integrated circuit (IC) substrate having various devices and an interconnection structure that couples the devices to an integrated circuit; forming a passivation structure on the IC substrate; coating a polyimide layer on the passivation structure, wherein the polyimide layer includes more than 50% aliphatic amide (AA) or Gamma-Butyrolactone (GBL); patterning the polyimide layer to form a polyimide opening in the polyimide layer; etching the passivation structure through the polyimide opening of the polyimide layer; and forming a bonding pad within the polyimide opening.

The present disclosure provides an integrated circuit (IC) structure in accordance with some embodiments. The IC structure includes an IC substrate having various devices and an interconnection structure to couple the devices to an integrated circuit; a first passivation layer on the IC substrate; a redistribution layer in the first passivation layer; a second passivation layer on the redistribution layer; a polyimide layer on the passivation layer, wherein the polyimide layer includes more than 50% aliphatic amide (AA) or Gamma-Butyrolactone (GBL); and a bonding pad partially embedded in the second passivation layer and landing on the redistribution layer.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
    providing an integrated circuit (IC) substrate having various devices and an interconnection structure that couples the devices to an integrated circuit;
    forming a first passivation layer on the IC substrate;
    forming a super high-density metal-insulator-metal (SHD-MIM) capacitor enclosed by the first passivation layer;
    forming a redistribution layer, wherein the redistribution layer includes a vertical portion in the first passivation layer and a horizontal portion over the first passivation layer, wherein the redistribution layer is electrically connected to the interconnection structure, wherein the redistribution layer overlaps vertically with the SHD-MIM capacitor but free of overlapping horizontally with the SHD-MIM capacitor, wherein the horizontal portion is L-shaped in a top view of the IC substrate wherein a bottom surface of the vertical portion is coplanar with a bottom surface of the first passivation layer, and wherein the forming of the redistribution layer includes:
        performing an etching process, thereby forming an opening in the first passivation layer to expose a portion of the interconnection structure;
        forming the vertical portion in the opening and the horizontal portion over the first passivation layer; and
        pattering the horizontal portion;
    forming a second passivation layer on the redistribution layer and the first passivation layer;
    forming a polyimide layer on the second passivation layer;
    patterning the polyimide layer, resulting in a polyimide opening in the polyimide layer, wherein the polyimide opening has a curved sidewall defined by a gradual increasing slope from a bottom portion of the curved sidewall to a top portion of the curved sidewall; and
    etching the second passivation layer through the polyimide opening using the polyimide layer as an etch mask.

2. The method of claim 1, wherein the polyimide layer is a photosensitive material and the patterning of the polyimide layer includes:
    performing an exposure process to the polyimide layer by photon radiation to change exposed portions of the polyimide layer; and
    developing the exposed polyimide layer in a developing solution to form the polyimide opening in the polyimide layer.

3. The method of claim 1, wherein the curved sidewall has a first slope at the top portion of the curved sidewall and a second slope at the bottom portion of the curved sidewall, wherein the etching of the second passivation layer includes etching the second passivation layer to form a passivation opening in the second passivation layer such that the redistribution layer is exposed within the passivation opening, wherein the passivation opening has a passivation sidewall defined by a third slope smaller than the first slope and larger than the second slope, the method further including forming a bonding pad on the redistribution layer within the passivation opening of the second passivation layer.

4. The method of claim 3, wherein the forming of the bonding pad on the redistribution layer includes forming the bonding pad on sidewalls of the polyimide layer within the polyimide opening and on sidewalls of the second passivation layer within the passivation opening.

5. The method of claim 3, wherein the SHD-MIM capacitor is partially overlapped with the bonding pad and is extended from the bonding pad to an edge of the IC structure from a top view, and wherein a first end of the L-shaped horizontal portion partially overlaps with the bonding pad and a second end of the L-shaped horizontal portion extends from the bonding pad away from a chip corner.

6. The method of claim 1, wherein the forming of the polyimide layer includes forming the polyimide layer with a tensile strength greater than 170 MPa, and a Young's module greater than 4 GPa.

7. The method of claim 1, wherein the forming of the polyimide layer includes coating the polyimide layer that includes more than 50% aliphatic amide (AA) or more than 40% Gamma-Butyrolactone (GBL).

8. The method of claim 7, wherein the polyimide layer includes AA in a range from 50% to 60% and polyamic acid ester (PAE) in a range from 30% to 40%.

9. The method of claim 7, wherein the polyimide layer includes GBL in a range from 40% to 50% and PAE in a range from 25% to 35%.

10. A method, comprising:
    providing an integrated circuit (IC) substrate having various devices and an interconnection structure that couples the devices to an integrated circuit;
    forming a first passivation layer over the IC substrate;
    forming a super high-density metal-insulator-metal (SHD-MIM) capacitor in the first passivation layer at a corner of the IC substrate, wherein the SHD-MIM capacitor has a periphery entirely enclosed by the first passivation layer;
    forming a redistribution layer including a vertical portion embedded in the first passivation layer electrically connected to the interconnection structure and a horizontal portion over the first passivation layer electrically free of connection from the SHD-MIM capacitor;
    forming a second passivation layer on the first passivation layer and the horizontal portion of the redistribution layer, wherein a bottom of the second passivation layer is coplanar with and directly contacts a bottom surface of the horizontal portion of the redistribution layer and a top surface of the first passivation layer;
    coating a polyimide layer on the second passivation layer, wherein the polyimide layer includes more than 50% aliphatic amide (AA) or Gamma-Butyrolactone (GBL);
    patterning the polyimide layer to form a polyimide opening in the polyimide layer, wherein the polyimide opening has a footing portion with a gradually decreasing slope from a top to a bottom of the polyimide opening, and wherein the footing portion extends into the second passivation layer;
    etching the second passivation layer through the polyimide opening of the polyimide layer to form a passivation opening and to expose a portion of the horizontal portion of the redistribution layer; and forming a bonding pad within the polyimide opening and the passivation opening, wherein the bonding pad is disposed over the horizontal portion and horizontally shifted away from the vertical portion, wherein the bonding pad includes an under-bump metallization (UBM) layer over a sidewalls of the polyimide opening and the passivation opening to prevent diffusion of bump metals into the IC, a copper layer over the UBM layer and contacting the horizontal portion of the redistribution layer, and a solder layer over the copper layer; and wherein the UBM layer includes a CrCu diffusion barrier layer.

11. The method of claim 10, wherein the coating of the polyimide layer includes coating the polyimide layer that is photosensitive and the patterning of the polyimide layer includes:
performing an exposure process to the polyimide layer by photon radiation to change exposed portions of the polyimide layer; and
developing the exposed polyimide layer in a developing solution to form the polyimide opening in the polyimide layer.

12. The method of claim 10, wherein a sidewall of the polyimide opening is defined by a first slope at a top portion of the polyimide opening and a second slope at a bottom portion of the polyimide opening, wherein a sidewall of the passivation opening is defined by a third slope smaller than the first slope and larger than the second slope.

13. The method of claim 10, wherein
the etching of the second passivation layer includes etching the second passivation layer, through the polyimide opening using the polyimide layer as an etch mask, to form the passivation opening in the second passivation layer such that a portion of the horizontal portion of the redistribution layer is exposed within the passivation opening, and
the forming of the bonding pad includes forming the bonding pad over the exposed portion of the horizontal portion of the redistribution layer within the passivation opening, wherein the copper layer of the bonding pad includes a flat top surface with the solder layer formed thereover, and a funnel-shaped bottom portion directly contacting the UBM layer and the horizontal portion.

14. The method of claim 13, wherein the forming of the bonding pad includes forming the bonding pad directly on a sidewall of the polyimide opening and a sidewall of the passivation opening, and wherein the horizontal portion contacts both the UBM layer and the copper layer.

15. The method of claim 10, wherein the coating of the polyimide layer includes coating the polyimide layer that includes AA in a range from 50% to 60% and polyamic acid ester (PAE) in a range from 30% to 40%.

16. The method of claim 10, wherein the coating of the polyimide layer includes coating the polyimide layer that includes GBL in a range from 40% to 50% and PAE in a range from 25% to 35%; and wherein the coating of the polyimide layer includes forming the polyimide layer with a tensile strength greater than 170 MPa, and a Young's module greater than 4 GPa.

17. A method, comprising:
providing an integrated circuit (IC) substrate having various devices and an interconnection structure that couples the devices to an integrated circuit;
forming a passivation structure on the IC substrate, wherein the forming of the passivation structure includes:
forming a first passivation layer over the IC substrate;
embedding a super high-density metal-insulator-metal (SHD-MIM) capacitor in the first passivation layer at a chip corner, wherein the first passivation layer encompasses a periphery of the SHD-MIM capacitor entirely;
forming a redistribution layer over the first passivation layer, wherein the redistribution layer includes a vertical portion embedded in the first passivation layer electrically connected to the interconnection structure and a horizontal portion over the first passivation layer free of electrical connection from the SHD-MIM capacitor; and
forming a second passivation layer disposed over the horizontal portion and the first passivation layer, wherein the second passivation layer embeds the horizontal portion of the redistribution layer, wherein the second passivation layer includes a silicon oxide layer disposed over the horizontal portion and the first passivation layer, wherein a bottom surface of the silicon oxide layer, a bottom surface of the horizontal portion, and a top surface of the first passivation layer are coplanar; and wherein the second passivation layer further includes a silicon nitride layer disposed over the silicon oxide layer;
coating a photosensitive polyimide layer on the passivation structure, wherein the photosensitive polyimide layer includes more than 50% aliphatic amide (AA) without aromatic rings directly bonded on nitrogen atoms of the AA or Gamma-Butyrolactone (GBL);
exposing a portion of the photosensitive polyimide layer;
developing the exposed portion of the photosensitive polyimide layer in a developing solution to form a patterned polyimide layer with a polyimide opening, wherein the polyimide opening has a first slope at a top portion of the polyimide opening and a second slope at a bottom portion of the polyimide opening;
etching the passivation structure through the polyimide opening of the patterned polyimide layer to form a passivation opening, wherein the passivation opening has a third slope less than the first slope and greater than the second slope; and
forming a bonding pad within the polyimide opening and the passivation opening and landing on the exposed portion of the horizontal portion of the redistribution layer, wherein the vertical portion of the redistribution layer is free of overlapping vertically with the bonding pad and the SHD-MIM capacitor, such that the bonding pad is redirected to a position further away from the chip corner compared with the bonding pad and the SHD-MIM capacitor to avoid cracking of the IC substrate.

18. The method of claim 17, wherein the etching of the passivation structure includes etching the second passivation layer through the polyimide opening using the patterned polyimide layer as an etch mask, to form a passivation opening hole in the second passivation layer such that a portion of the horizontal portion of the redistribution layer is exposed within the passivation opening; and
the forming of the bonding pad includes forming the bonding pad on the exposed portion of the horizontal portion of the redistribution layer within the passivation opening of the second passivation layer.

19. The method of claim 18, wherein the forming of the bonding pad includes forming the bonding pad directly on sidewall of the photosensitive polyimide layer within the polyimide opening and sidewalls of the second passivation layer within the passivation opening.

20. The method of claim 17, wherein the SHD-MIM capacitor extends away from the bonding pad in a first direction toward a corner of the IC substrate, while the horizontal portion extends away from the bonding pad in a second direction opposite to the first direction away from the corner of the IC substrate.

* * * * *